United States Patent
Fonataine et al.

(10) Patent No.: US 8,659,371 B2
(45) Date of Patent: Feb. 25, 2014

(54) THREE-DIMENSIONAL MATRIX STRUCTURE FOR DEFINING A COAXIAL TRANSMISSION LINE CHANNEL

(75) Inventors: Daniel L. Fonataine, Hudson, NH (US); David Sherrer, Radford, VA (US)

(73) Assignees: BAE Systems Information and Electronic Systems Integration Inc., Nashua, NH (US); Nuvotronics, LLC, Radford, VA (US)

( * ) Notice: Subject to any disclaimer, the term of this patent is extended or adjusted under 35 U.S.C. 154(b) by 407 days.

(21) Appl. No.: 12/713,946

(22) Filed: Feb. 26, 2010

(65) Prior Publication Data
US 2011/0115580 A1 May 19, 2011

Related U.S. Application Data

(60) Provisional application No. 61/157,063, filed on Mar. 3, 2009.

(51) Int. Cl.
*H01P 3/06* (2006.01)

(52) U.S. Cl.
USPC .......................................... 333/243; 333/244

(58) Field of Classification Search
USPC ......... 333/243, 244, 238, 237, 113, 114, 115; 343/770
See application file for complete search history.

(56) References Cited

U.S. PATENT DOCUMENTS

| | | | |
|---|---|---|---|
| 2,812,501 A | * | 11/1957 | Sommers ....................... 333/238 |
| 2,914,766 A | * | 11/1959 | Butler ............................ 343/771 |
| 2,997,519 A | | 8/1961 | Hines et al. |
| 3,560,896 A | | 2/1971 | Essinger |
| 3,760,306 A | | 9/1973 | Spinner et al. |
| 3,775,844 A | * | 12/1973 | Parks ................................ 29/830 |
| 3,789,129 A | | 1/1974 | Ditscheid |
| 4,365,222 A | | 12/1982 | Lampert |
| 4,414,424 A | | 11/1983 | Mizoguchi et al. |
| 4,437,074 A | | 3/1984 | Cohen et al. |
| 4,521,755 A | | 6/1985 | Carlson et al. |

(Continued)

FOREIGN PATENT DOCUMENTS

| | | |
|---|---|---|
| CA | 2055116 | 5/1992 |
| DE | 3623093 A1 | 1/1988 |

(Continued)

OTHER PUBLICATIONS

Jeong, Inho et al., "High-Performance Air-Gap Transmission Lines and Inductors for Millimeter-Wave Applications", IEEE Transactions on Microwave Theory and Techniques, Dec. 2002, pp. 2850-2855, vol. 50, No. 12.

(Continued)

*Primary Examiner* — Benny Lee
(74) *Attorney, Agent, or Firm* — Maine Cernota & Rardin; Andrew P. Cernota

(57) ABSTRACT

A system is provided for three dimensional coaxial transmission of signals in a micro-machined component, the system having, a micro-machined component matrix with a first metallic sheet having a plurality of first access holes disposed therein; a second metallic sheet having a plurality of second access holes disposed therein; a plurality of metal posts disposed between the first and second metallic sheets such that the metallic sheets are maintained at a desired distance; walls defining a coaxial transmission channel; and a coaxial transmission core disposed within the channel.

14 Claims, 6 Drawing Sheets

(56) References Cited

U.S. PATENT DOCUMENTS

| | | | |
|---|---|---|---|
| 4,581,301 A | 4/1986 | Michaelson | |
| 4,673,904 A | 6/1987 | Landis | |
| 4,700,159 A | 10/1987 | Jones, III | |
| 4,771,294 A | 9/1988 | Wasilousky | |
| 4,857,418 A | 8/1989 | Schuetz | |
| 4,876,322 A | 10/1989 | Budde et al. | |
| 4,969,979 A | 11/1990 | Appelt et al. | |
| 5,072,201 A | 12/1991 | Devaux et al. | |
| 5,334,956 A | 8/1994 | Leding et al. | |
| 5,381,157 A | 1/1995 | Shiga | |
| 5,406,235 A | 4/1995 | Hayashi | |
| 5,430,257 A | 7/1995 | Lau et al. | |
| 5,454,161 A | 10/1995 | Beilin et al. | |
| 5,633,615 A | 5/1997 | Quan | |
| 5,682,124 A * | 10/1997 | Suski | 333/1 |
| 5,712,607 A | 1/1998 | Dittmer et al. | |
| 5,724,012 A | 3/1998 | Teunisse | |
| 5,793,272 A | 8/1998 | Burghartz et al. | |
| 5,990,768 A | 11/1999 | Takahashi et al. | |
| 6,008,102 A | 12/1999 | Alford et al. | |
| 6,054,252 A | 4/2000 | Lundy et al. | |
| 6,180,261 B1 | 1/2001 | Inoue et al. | |
| 6,293,965 B1 | 9/2001 | Berg et al. | |
| 6,294,965 B1 | 9/2001 | Merrill et al. | |
| 6,457,979 B1 | 10/2002 | Dove et al. | |
| 6,466,112 B1 | 10/2002 | Kwon et al. | |
| 6,535,088 B1 | 3/2003 | Sherman et al. | |
| 6,600,395 B1 | 7/2003 | Handforth et al. | |
| 6,603,376 B1 | 8/2003 | Handforth et al. | |
| 6,888,427 B2 | 5/2005 | Sinsheimer et al. | |
| 6,981,414 B2 | 1/2006 | Knowles et al. | |
| 7,012,489 B2 | 3/2006 | Sherrer et al. | |
| 7,148,141 B2 | 12/2006 | Shim et al. | |
| 7,148,772 B2 | 12/2006 | Sherrer et al. | |
| 7,239,219 B2 | 7/2007 | Brown et al. | |
| 7,259,640 B2 | 8/2007 | Brown et al. | |
| 7,400,222 B2 | 7/2008 | Kwon et al. | |
| 7,405,638 B2 | 7/2008 | Sherrer et al. | |
| 7,449,784 B2 | 11/2008 | Sherrer et al. | |
| 7,508,065 B2 | 3/2009 | Sherrer et al. | |
| 7,649,432 B2 | 1/2010 | Sherrer et al. | |
| 7,656,256 B2 | 2/2010 | Houck et al. | |
| 7,658,831 B2 | 2/2010 | Mathieu et al. | |
| 7,755,174 B2 | 7/2010 | Rollin et al. | |
| 7,898,356 B2 | 3/2011 | Sherrer et al. | |
| 7,948,335 B2 | 5/2011 | Sherrer et al. | |
| 8,031,037 B2 | 10/2011 | Sherrer et al. | |
| 2002/0075104 A1 | 6/2002 | Kwon et al. | |
| 2003/0029729 A1 | 2/2003 | Cheng et al. | |
| 2003/0052755 A1 | 3/2003 | Barnes et al. | |
| 2003/0222738 A1 | 12/2003 | Brown et al. | |
| 2004/0007470 A1 | 1/2004 | Smalley | |
| 2004/0076806 A1 | 4/2004 | Miyanaga et al. | |
| 2004/0263290 A1 | 12/2004 | Sherrer et al. | |
| 2005/0030124 A1 | 2/2005 | Okamoto et al. | |
| 2005/0045484 A1 | 3/2005 | Smalley et al. | |
| 2005/0156693 A1 | 7/2005 | Dove et al. | |
| 2005/0230145 A1 | 10/2005 | Ishii et al. | |
| 2008/0199656 A1 | 8/2008 | Nichols et al. | |
| 2008/0240656 A1 | 10/2008 | Rollin et al. | |
| 2010/0109819 A1 | 5/2010 | Houck et al. | |
| 2010/0296252 A1 | 11/2010 | Rollin et al. | |
| 2011/0123783 A1 | 5/2011 | Sherrer | |
| 2011/0181376 A1 | 7/2011 | Vanhille et al. | |
| 2011/0181377 A1 | 7/2011 | Vanhille et al. | |
| 2011/0210807 A1 | 9/2011 | Sherrer et al. | |
| 2011/0273241 A1 | 11/2011 | Sherrer et al. | |
| 2013/0050055 A1 | 2/2013 | Paradiso et al. | |

FOREIGN PATENT DOCUMENTS

| | | |
|---|---|---|
| EP | 0 398 019 A1 | 11/1990 |
| EP | 0485831 A1 | 5/1992 |
| EP | 0 845 831 A2 | 6/1998 |
| EP | 0 911 903 A2 | 4/1999 |
| FR | 2086327 | 12/1971 |
| JP | 6085510 A | 3/1994 |
| JP | 6302964 | 10/1994 |
| JP | 10041710 | 2/1998 |
| WO | 00/07218 | 2/2000 |
| WO | 00/39854 | 7/2000 |
| WO | 0206152 | 1/2002 |
| WO | 02/080279 A1 | 10/2002 |
| WO | 2004004061 | 1/2004 |

OTHER PUBLICATIONS

Elliott Brown/MEMGen Corporation, "RF Applications of EFAB Technology", MTT-S IMS, 2003, 1-15 pages.

Brown, E.R. et al., "A Low-Loss Ka-Band Filter in Rectangular Coax Made by Electromechanical Fabrication", IEEE Microwave and Wireless Components Letters, 2004, 8 pages.

Yoon, Jun-Bo, "3-D Lithography and Metal Surface Micromachining for RF and Microwave Mems", IEEE, 2002, pp. 673-676.

Chomnawang, Nimit et al., "On-Chip 3D Air Core Micro-Inductor for High Frequency Applications Using Deformation of Sacrificial Polymer", Proc. SPIE, Mar. 2001, pp. 54-62; vol. 4334.

Park et al., "Electroplated Micro-Inductors and Micro-Transformers for Wireless Applications" IMAPS, 2002, 5 pages.

Katehi et al., "MEMS and Si Micromachined Circuits for High-Frequency Applications", IEEE Transactions on Microwave Theory and Techniques, Mar. 2002, pp. 858-866, vol. 50, No. 3.

Yoon et al., "Monolithic Integration of 3-D Electroplated Microstructures with Unlimited Number of Levels Using Planarization with a Sacrificial Metallic Mold (PSMM)", Twelfth IEEE Int'l Conf. on Micro Electro Mechanical Systems, Jan. 1999, pp. 624-629, Orlando, FL.

Yoon et al., "CMOS-Compatible Surface Micromachined Suspended-Spiral Inductors for Multi-GHz Silicon RF ICs", IEEE Electron Device Letters, Oct. 2002, pp. 591-593, vol. 23, No. 10.

Yoon et al., "Multilevel Microstructure Fabrication Using Single-Step 3D Photolithography and Single-Step Electroplating", Proc. of SPIE, Sep. 1998, pp. 358-366, vol. 3512.

Lee et al., "Micromachining Applications of a High Resolution Ultrathick Photoresist", J. Vac. Sci. Technol. B 13(6), Nov./Dec. 1995, pp. 3012-3016.

Guckel, H., "High-Aspect-Ratio Micromachining Via Deep X-Ray Lithography", Proceedings of the IEEE, Aug. 1998, pp. 1586-1593, vol. 86, No. 8.

Yoon et al., "Monolithic High-Q Overhang Inductors Fabricated on Silicon and Glass Substrates", International Electron Devices Meeting, Dec. 1999, pp. 753-756, Washington D.C.

Engelmann et al., "Fabrication of High Depth-to-Width Aspect Ratio Microstructures", IEEE Micro Electro Mechanical Systems, Feb. 1992, pp. 93-98.

Frazier et al., "Metallic Microstructures Fabricated Using Photosensitive Polyimide Electroplating Molds", Journal of Microelectromechanical Systems, Jun. 1993, pp. 87-94, vol. 2, No. 2.

Yoon et al., "High-Performance Three-Dimensional On-Chip Inductors Fabricated by Novel Machining Technology for RF MMIC", IEEE MTT-S Int'l Microwave Symposium Digest, Jun. 13-19, 1999, pp. 1523-1526, vol. 4.

Loechel et al., "Application of Ultraviolet Depth Lithography for Surface Micromachining", J. Vac. Sci. Technology B 13(6), Nov./Dec. 1995, pp. 2934-2939.

Yoon et al., "High-Performance Electroplated Solenoid-Type Integrated Inductor (SI2) for RF Applications Using Simple 3D Surface Micromachining Technology", Int'l Election Devices Meeting, Dec. 6-9, 1998, pp. 544-547, San Francisco, CA.

Tummala et al., "Microelectronics Packaging Handbook", Jan. 1, 1989, XP002477031, pp. 710-714.

Vanhille, Kenneth J. et al.,"Micro-Coaxial Impedance Transformers", Journal of Latex Class Files, vol. 6, No. 1, Jan. 2007.

Darwish, Ali et al., "Vertical Balun and Wilkinson Divider", 2002 IEEE MTT-S I Digest, pp. 109-112.

Cole, B.E., et al., Micromachined Pixel Arrays Integrated with CMOS for Infrared Applications, pp. 64-64 (2000).

(56) References Cited

OTHER PUBLICATIONS

De Los Santos, H.J., Introduction to Microelectromechanical (MEM) Microwave Systems (pp. 4, 7-8, 13) (1999).

Deyong, C., et al., A Microstructure Semiconductor Thermocouple for Microwave Power Sensors, 1997 Asia Pacific Microwave Conference, pp. 917-919.

Filipovic, et al., "Modeling, Design, Fabrication, and Performance of Rectangular u-Coaxial Lines and Components", Microwave Symposium Digest, 2006, IEEE; Jun. 1, 2006; pp. 1393-1396.

Franssila, S., Introduction to Microfabrication, (pp. 8) (2004).

Ghodisian, B., et al., Fabrication of Affordable Metallic Microstructures by Electroplating and Photoresist Molds, 1996, pp. 68-71.

Hawkins, C.F., The Microelectronics Failure Analysis, Desk Reference Edition (2004).

Kwok, P.Y., et al., Fluid Effects in Vibrating Micromachined Structures, Journal of Microelectromechanical Systems, vol. 14, No. 4, Aug. 2005, pp. 770-781.

Madou, M.J., Fundamentals of Microfabrication: The Science of Miniaturization, 2d Ed., 2002 (Roadmap; pp. 615-668).

Sedky, S., Post-Processing Techniques for Integrated MEMS (pp. 9, 11, 164) (2006).

Yeh, J.L., et al., Copper-Encapsulated Silicon Micromachined Structures, Journal of Microelectromechanical Systems, vol. 9, No. 3, Sep. 2000, pp. 281-287.

Saito, Y., Fontaine, D., Rollin, J-M., Filipovic, D., "Micro-Coaxial Ka-Band Gysel Power Dividers," Microwave Opt Technol Lett 52: 474-478, 2010.

* cited by examiner

THREE-DIMENSIONAL MATRIX STRUCTURE FOR DEFINING A COAXIAL TRANSMISSION LINE CHANNEL

RELATED APPLICATIONS

This application claims the benefit of U.S. Provisional Applications No. 61/157,063, filed Mar. 3, 2009. This application is herein incorporated by reference in its entirety for all purposes.

STATEMENT OF GOVERNMENT INTEREST

This invention was made with United States Government support under Contract Number W911QX-04-C-0097 awarded by the United States Army. The United States Government has certain rights in this invention.

FIELD OF THE INVENTION

The invention relates to three dimensional matrix for micro machined coaxial components, and more particularly, to such a matrix wherein the coaxial components are disposed within a periodic matrix and routing grid.

BACKGROUND OF THE INVENTION

Known supporting structures fail to facilitate stacking of multiple layers of coaxial line and access to both sides of a particular layer. A mechanically sound superstructure is required to capture components and RF transmission lines in a uniform assembly without adding further complexity to the fabrication process.

A known method for containing/securing micro-machined components, illustrated in FIG. 1 was to use a host substrate that through direct adhesion keeps the components in place. As illustrated in FIG. 1, a section of coaxial line is mounted directly to a substrate which provides it with support on one side.

The principal disadvantage of this known method is that the substrate prevents the stacking of formed components and blocks access to the lower surface of the components since these are adhered to the substrate to fix them in place. Further, if the securing substrate were removed, the arrangement of the coaxial lines, though weakly connected, would not have the mechanical integrity needed for typical handling and assembly operations.

Clearly, what is needed therefore is a method and system for securing and stacking formed components within a three dimensional matrix that provides mechanical strength and security and permits access to components from the lower surface of the matrix.

SUMMARY OF THE INVENTION

One embodiment of the present invention provides a system for three dimensional coaxial transmissions of signals in a micro-machined component, the system comprising: a first micro-machined component matrix comprising: a first metallic sheet having a plurality of first access holes disposed therein; a second metallic sheet having a plurality of second access holes disposed therein; a plurality of metal posts disposed between the first and second metallic sheets such that the metallic sheets are maintained at a desired distance; walls defining a coaxial transmission channel, the walls being disposed between the first and second metallic sheets, perpendicularly to the first and second metallic sheets; a coaxial transmission core disposed within the channel.

Another embodiment of the present invention provides such a system wherein the walls are configured with a plurality of side wall access holes.

A further embodiment of the present invention provides such a system wherein the side wall access holes are aligned with the first and second access holes in the first and second metallic sheets.

Still another embodiment of the present invention provides such a system wherein the metal posts are arranged in a periodic pattern.

A still further embodiment of the present invention provides such a system wherein at least some of the posts are disposed equidistantly from four proximate first access holes and four proximate second access holes.

Still even another embodiment of the present invention provides such a system wherein the holes are arranged in a periodic pattern.

Yet another embodiment of the present invention provides such a system further comprising a third metallic sheet disposed above the second sheet, and a second plurality of metallic posts disposed between the second and third sheets.

A yet further embodiment of the present invention provides such a system further comprising a coaxial transmission core hole in the second sheet, through which the coaxial transmission core passed to a space disposed between the second and third sheets.

Even another embodiment of the present invention provides such a system further comprising a plurality of the matrices that are electrically coupled to each other.

An even further embodiment of the present invention provides such a system wherein the metallic sheets are copper.

Yet still another embodiment of the present invention provides such a system wherein the metal posts are copper.

A yet still further embodiment of the present invention provides such a system further comprising a second micro-machined component matrix disposed proximate to the first micro-machined component matrix.

Still even another embodiment of the present invention provides such a system wherein a face of the first metallic sheet of the first micro-machined component matrix is disposed proximate to a face of a first sheet of the second micro-machined component matrix.

A still even further embodiment of the present invention provides such a system wherein an edge of the first micro-machined component matrix is disposed proximate to an edge of the second micro-machined component matrix.

Yet even another embodiment of the present invention provides such a system wherein the coaxial transmission core of the first micro-machined component matrix is electrically coupled to a coaxial transmission core of the second micro-machined component matrix.

One embodiment of the present invention provides a micro-machined component matrix, the matrix comprising: at least one periodic array of columns; a plurality of conductive sheets separated by the at least one periodic array of columns, the conductive sheets being disposed in parallel planes; a plurality of walls disposed between opposing surfaces of the conductive sheets, thereby defining at least one channel; at least one conductive core, the conductive core disposed within the at least one channel, the core and the channel forming a coaxial component; a plurality of access holes disposed in the plurality of conductive sheets.

Another embodiment of the present invention provides such a matrix wherein the access holes are arranged in an ordered array.

A further embodiment of the present invention provides such a matrix wherein the columns are positioned such that the columns are disposed between the access holes.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

One embodiment of the present invention utilizes "stripline" or tri-plate transmission line medium, utilizing upper and lower metal planes. One can then replace the core dielectric, which provides the mechanical integrity, with an arrangement of metal posts connected to the top, middle, and lower plates of the matrix to provide the rigidity—somewhat like a honey-comb laminate.

Figure 1:
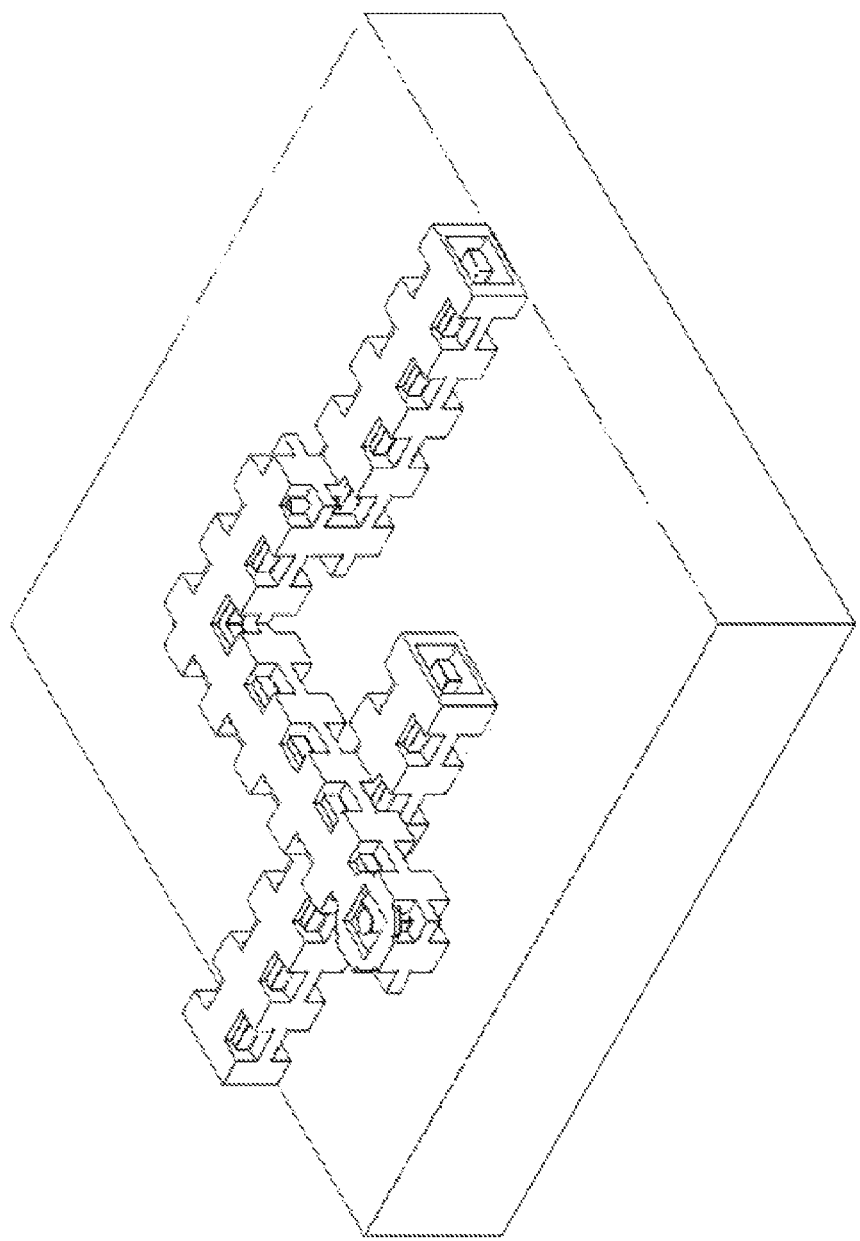
FIG. 1 is a perspective view illustrating a micro-machined coaxial component configured in accordance with a known system.
Figure 2:
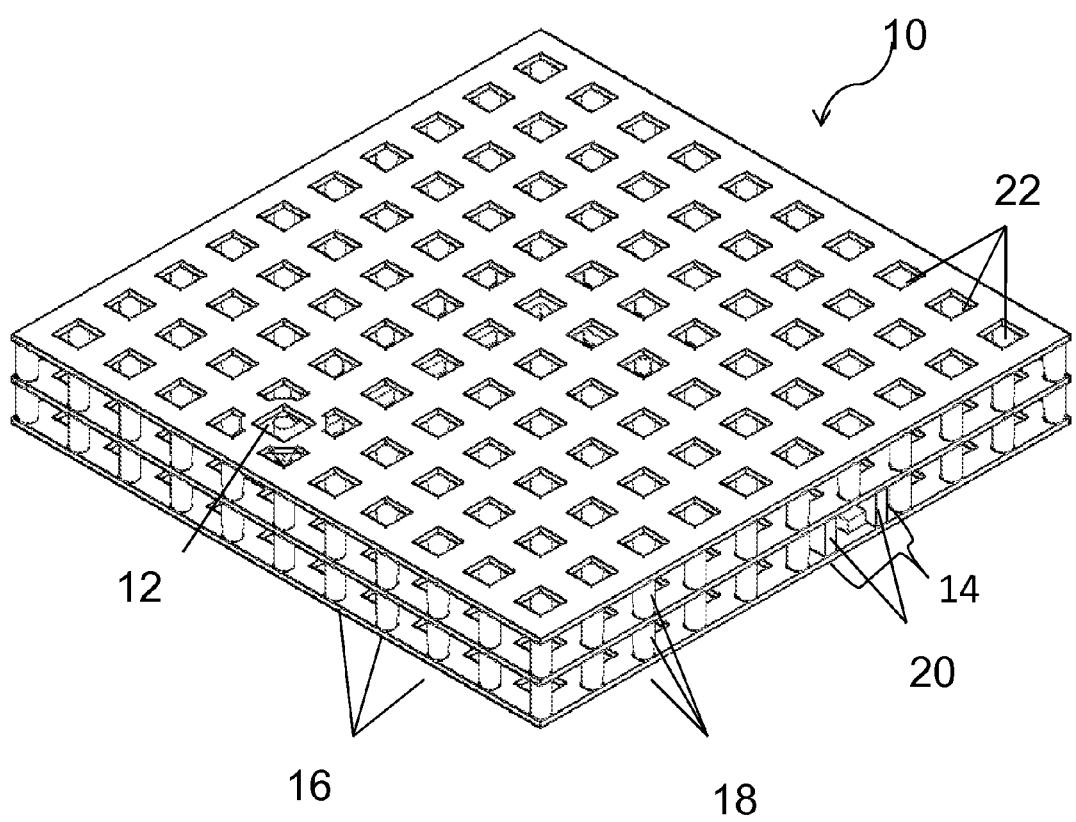
FIG. 2 is a perspective view illustrating a matrix for a micro-machined coaxial component configured in accordance with one embodiment of the present invention.

One embodiment of the present invention provides a method of embedding the components in a superstructure 10 allows both stacking and surface access to the core 12 of the coaxial component 14. As illustrated in FIG. 2, sheets 18 separated by an array of posts 16 are provided comprising a matrix superstructure 10. This matrix superstructure 10 is compatible with a process that forms the core or center conductor 12 and side walls 20 of component 14 to be mounted therein, thereby simplifying the construction process of both the components and the matrix. In one embodiment of the present invention, the sheets 18, side walls 20 and posts 16 may be configured from metal or other suitable conductive material, and may according to one such embodiment be manufactured through a series of micromachining techniques such as that performed under the service mark POLYSTRATA by Nuvotronics of Radford, VA. Such processes are known to those skilled in the art. One skilled in the art will appreciate that other materials with suitable conductivity may be used.

Figure 3:
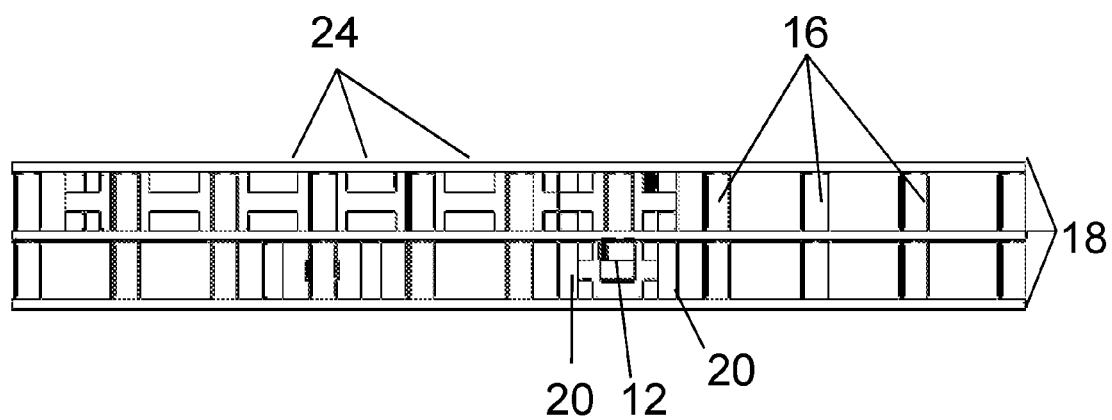
FIG. 3 is an elevation view illustrating a matrix for a micro-machined coaxial component configured in accordance with one embodiment of the present invention.

As illustrated in FIG. 3 a center conductor 12 and side walls 20 of the structure are disposed between the top, middle, and bottom sheets 18 of the matrix. These sheets 18 provide both mechanical and electrical function. In such an embodiment, the matrices are stacked and posts disposed so as to span the vertical distance between the lower sheet and middle sheet (not shown). These posts are also arranged on the same pitch as the matrix release holes and appear at every "intersection" of the matrix that does not have component metal there already (e.g. transmission line side wall).

Figure 4:
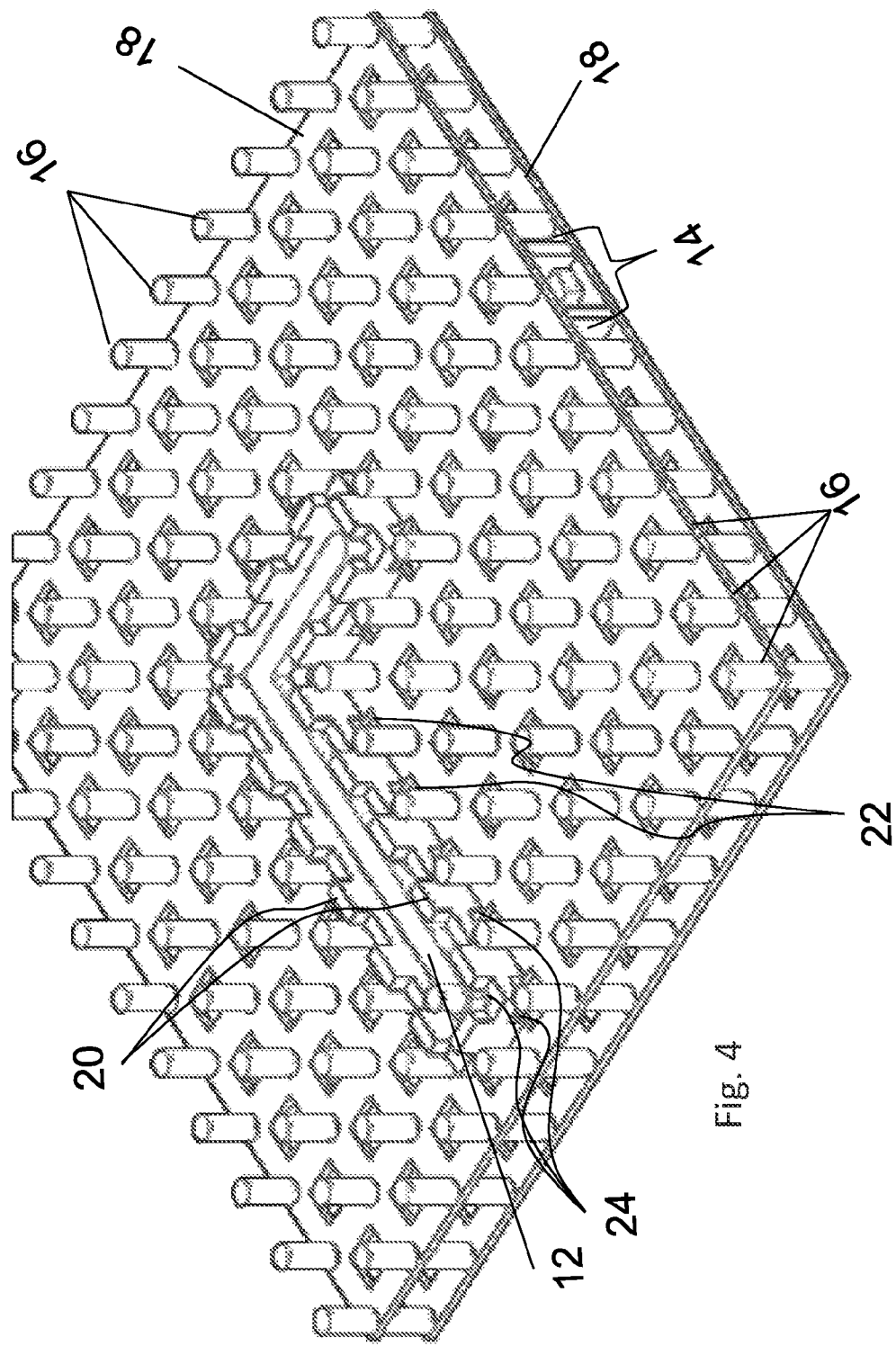
FIG. 4 is a perspective view illustrating a matrix for a micro-machined coaxial component configured in accordance with one embodiment of the present invention wherein a top layer of said matrix is removed to illustrate the internal structure of the matrix.

A lower matrix sheet 18 of one embodiment of the present invention is illustrated in FIGS. 2-4 providing a plurality of access holes 22 (FIGS. 2, 4) in the sheet 18 and correspond to access holes 24 (FIGS. 3, 4) in the transmission line side walls 20. These holes 24 disposed in the side walls 20 of the transition line are necessary to chemically remove sacrificial material used in the device construction. Posts 16 support and separate sheets 18 (FIG. 4). Such a configuration provides a uniform periodicity of the holes 22 in the matrix sheet 18 which is in turn reflected in the uniform periodicity of the holes 24 disposed in the side walls 20 of the transition line and allows the transmission line components 14 including center elements 12 (FIG. 4) to be laid out on a regular grid. One skilled in the art will appreciate that this provides a convenient mechanism for layout of large, complex circuits. In one embodiment of the present invention, the sheet configuration provides a 50% fill for the grid (e.g. 250 um wide holes on a 500 um pitch), one skilled in the art will appreciate that alternative embodiments may be made having differing fill ratios within the present invention. As illustrated in FIG. 2, the posts 16 located in the interior of the panel 10 are equidistantly disposed from four proximate access holes 22 in one sheet 18 and four proximate second access holes 22 in a second sheet 18.

Figure 5:
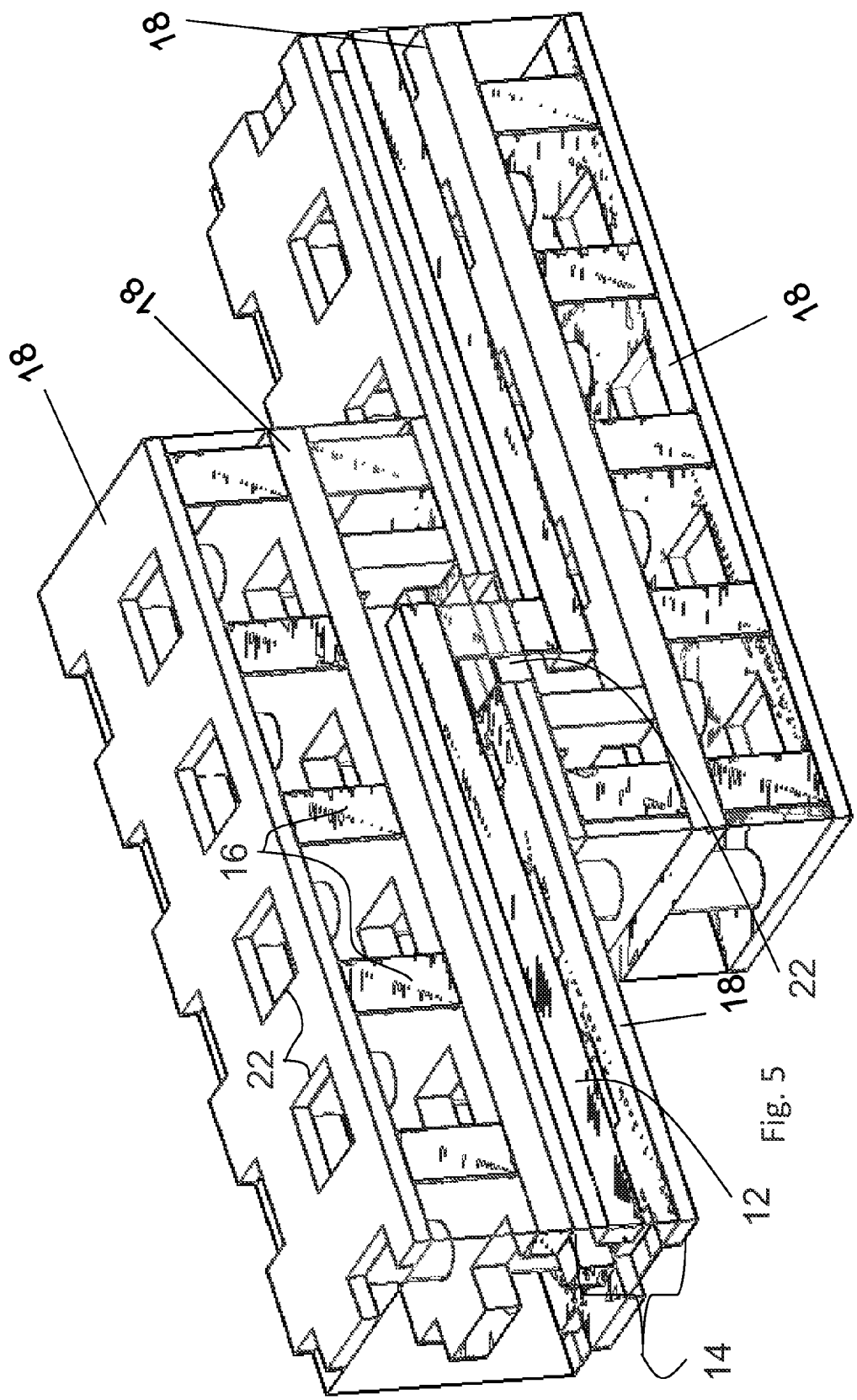
FIG. 5 is a detail perspective view illustrating two joined matrices for a micro-machined coaxial component configured in accordance with one embodiment of the present invention.
Figure 6:
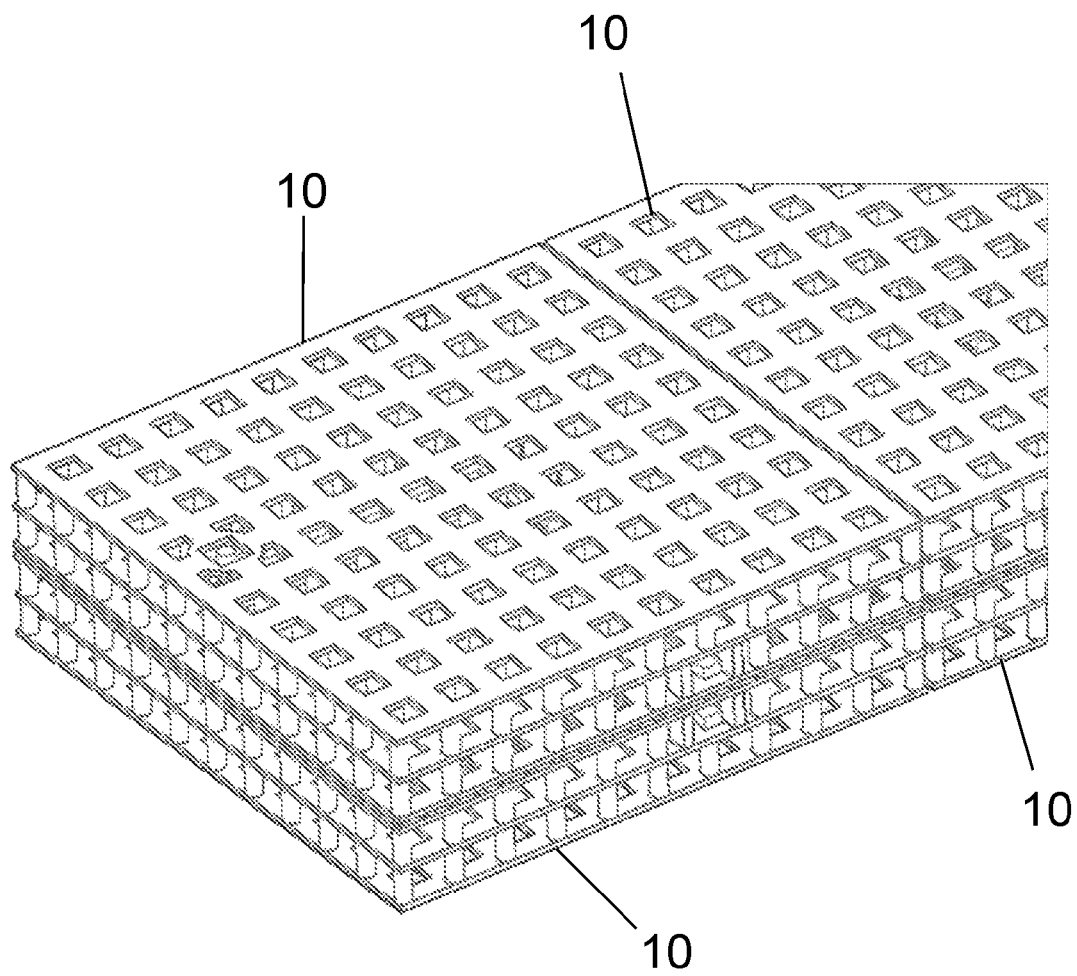
FIG. 6 is a perspective view illustrating two joined matrices for a micro-machined coaxial component configured in accordance with one embodiment of the present invention.

In one embodiment illustrated in FIGS. 5 and 6 a plurality of such structures 10 are joined, so that a conductive center element 12 (FIG. 5) may continue through a plurality of layers. The matrix sheets 18, posts 16, and holes 22 are arrayed such that they are aligned as shown in FIG. 5 between matrices 10 (FIG. 6), and such that the line 14 (FIG. 5) may conduct transmissions between the sections.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

I claim:

1. A system for three dimensional coaxial transmissions of signals in a micro-machined component, the system comprising:

a first micro-machined component matrix comprising:
a first metallic sheet having a plurality of first access holes disposed therein;
a second metallic sheet having a plurality of second access holes disposed therein;
a plurality of metal posts disposed between said first and second metallic sheets such that said metallic sheets are maintained at a desired distance;
walls having a plurality of side wall access holes disposed therein defining a coaxial transmission channel, said walls being disposed between said first and second metallic sheets, perpendicularly to said first and second metallic sheets;
wherein a side wall access hole in said plurality of side access holes is aligned with first and second access holes of said plurality of first and second access holes in said first and second metallic sheets a coaxial transmission core disposed within said channel.

2. The system according to claim 1 further comprising a second micro-machined component matrix disposed proximate to said first micro-machined component matrix.

3. The system according to claim 2 wherein said second micro-machined component matrix comprises a first sheet and a face of said first metallic sheet of said first micro-machined component matrix is disposed proximate to a face of said first sheet of said second micro-machined component matrix.

4. The system according to claim 2 wherein an edge of said first micro-machined component matrix is disposed proximate to an edge of said second micro-machined component matrix.

5. The system according to claim 2 wherein said coaxial transmission core of said first micro-machined component matrix is electrically coupled to a coaxial transmission core of said second micro-machined component matrix.

6. The system according to claim 1 wherein said first and second pluralities of access holes are arranged in a periodic pattern.

7. The system according to claim 1 further comprising a third metallic sheet disposed above said second sheet, and a second plurality of metallic posts disposed between said second and third sheets.

8. The system according to claim 7 further comprising a coaxial transmission core hole in said second sheet, through which said coaxial transmission core passed to a space disposed between said second and third sheets.

9. The system according to claim 1 further comprising at least a second micro-machined component matrix electrically coupled to said first micro-machined component matrix.

10. The system according to claim 1 wherein said first and second metallic sheets are copper.

11. The system according to claim 1 wherein said plurality of metal posts are copper.

12. The system according to claim 1 wherein metal posts in said plurality of metal posts are arranged in a periodic pattern.

13. The system according to claim 12 wherein at least some posts from said plurality of posts are disposed equidistantly from four proximate first access holes and four proximate second access holes.

14. A micro-machined component matrix, said matrix comprising:
   at least one periodic array of columns;
   a plurality of conductive sheets separated by said at least one periodic array of columns, said plurality of conductive sheets being disposed in parallel planes;
   a plurality of walls disposed between opposing surfaces of said plurality of conductive sheets, thereby defining at least one channel and having a plurality of side wall access holes disposed therein;
   at least one conductive core, said at least one conductive core disposed within said at least one channel, said core and said at least one channel forming a coaxial component;
   a plurality of conductive sheet access holes disposed in said plurality of conductive sheets
   wherein said plurality of conductive sheet access holes are arranged in an ordered array and columns in said at least one periodic array of columns are positioned such that said columns within said at least one array of columns are disposed between said conductive sheet access holes.

* * * * *

UNITED STATES PATENT AND TRADEMARK OFFICE
CERTIFICATE OF CORRECTION

| | | |
|---|---|---|
| PATENT NO. | : 8,659,371 B2 | Page 1 of 1 |
| APPLICATION NO. | : 12/713946 | |
| DATED | : February 25, 2014 | |
| INVENTOR(S) | : Daniel L. Fontaine and David Sherrer | |

It is certified that error appears in the above-identified patent and that said Letters Patent is hereby corrected as shown below:

Title Page,
Item [12], United States Patent, delete "Fonataine", insert --Fontaine--
Item [75], Inventor, delete "Fonataine", insert --Fontaine--

Signed and Sealed this
Sixth Day of May, 2014

Michelle K. Lee
*Deputy Director of the United States Patent and Trademark Office*